United States Patent [19]

Stridsberg

[11] Patent Number: 5,778,524
[45] Date of Patent: Jul. 14, 1998

[54] SURFACE MOUNT MACHINE CONCEPT

[75] Inventor: Lennart Stridsberg, Enskeda, Sweden

[73] Assignee: Mydata Automation AB, Bromma, Sweden

[21] Appl. No.: 669,414

[22] PCT Filed: Jan. 10, 1995

[86] PCT No.: PCT/SE95/00015

§ 371 Date: Aug. 21, 1996

§ 102(e) Date: Aug. 21, 1996

[87] PCT Pub. No.: WO95/19099

PCT Pub. Date: Jul. 13, 1995

[30] Foreign Application Priority Data

Jan. 10, 1994 [SE] Sweden .................. 9400077

[51] Int. Cl.[6] .................. H05K 3/30; H05K 13/02; H05K 13/04
[52] U.S. Cl. .................. 29/836; 29/740; 29/741; 29/742; 29/743; 29/759; 29/794; 198/346.1; 198/346.2
[58] Field of Search .................. 29/739–743, 759, 29/784, 786, 794, 833, 834, 836; 198/346.1, 346.2, 468.2

[56] References Cited

U.S. PATENT DOCUMENTS

| 4,231,153 | 11/1980 | Browne | 29/742 X |
| 4,631,812 | 12/1986 | Young | 29/742 X |
| 5,145,052 | 9/1992 | Santandrea et al. | 198/346.2 X |
| 5,191,702 | 3/1993 | Goedecke et al. | 29/759 X |
| 5,295,294 | 3/1994 | Ito | 29/740 |
| 5,323,528 | 6/1994 | Baker | 29/740 X |
| 5,452,509 | 9/1995 | Suzuki et al. | 29/794 X |
| 5,495,661 | 3/1996 | Gromer et al. | 29/740 |
| 5,517,748 | 5/1996 | Park | 29/741 |
| 5,522,123 | 6/1996 | Kugo | 29/742 X |

*Primary Examiner*—Peter Vo
*Attorney, Agent, or Firm*—Townsend and Townsend and Crew LLP

[57] ABSTRACT

A surface mount machine has a fixed X-axis comprising a straight beam rigidly mounted in the machine chassis along which one or several wagons move(s), each one carrying at least one component pick-up device. Below the X-beam for the X-axis there are component feeders which are organized in groups and which are accessible by the pick-up devices and at least two Y-axes provided by linear bearings, which are rigidly mounted in the machine chassis. Y-wagons for carrying printed circuit boards move along the Y-axes. As there are at least two PCB carrying Y-axes, it can be arranged that at least one of them presents a PCB on which the pick-up devices can place components. The time during which the pick-up devices must be idle during PCB unload and load will thereby be dramatically reduced.

29 Claims, 4 Drawing Sheets

SURFACE MOUNT MACHINE CONCEPT

BACKGROUND OF THE INVENTION

1. Field of the Invention

The present invention relates to methods of designing and producing pick and place machines, more particularly to pick and place machines for the production of electronic circuit boards, and more specifically to surface mounting machines.

2. Description of the Prior Art

Machines for automatic assembly of surface mount components on printed circuit boards (PCB) are built according to a few basic mechanical concepts regarding the mechanical layout of their means to move PCBs into and out from the machine, their means to move the pick-up heads that pick components from component feeders and place them on the PCB, and their means—if any—to move PCBs and/or feeders during the pick and place operations.

Most machines used for such assembly can be considered to belong to three main groups, which are illustrated in FIGS. 1-3. FIG. 1 shows a fixed X-axis, moving Y-axis machine; FIG. 2 shows a rotary turret machine; and FIG. 3 shows a fixed X-axis, fixed Y-axis machine.

FIG. 1 shows a machine with a fixed Y-axis shown as two linear bearings 1 and 2 and an X-axis 3 that is movable along the Y-axis. A carriage 4 is movable along the X-axis. On this carriage, there are one or several pick-up heads. The machine picks components from the component magazine banks 6 and 7 by moving the pick-up head 5 to a position above the selected component feeder, i.e. feeder 8, and moves thereafter to the printed circuit PCB 9, which is stationary during the assembly operation.

The natural way to arrange an automatic exchange of PCBs is to have a PCB conveyor 10 run in the X-direction of the machine. Far more than 50% of all component pick and place machines of the basic type shown in FIG. 1 are supplied with integral PCB conveyors. The Surface Mount Equipment Manufacturers Association (SMEMA) in the USA has published a standard regarding the physical and signal interface between such PCB conveyors. An assembled PCB 9, positioned as shown in FIG. 1, can be moved, for example, to the right on the conveyor 10 (passing the position 11) and a new, empty PCB 12 can enter the machine from the left. Both PCBs will move in the same direction on the conveyor 10.

FIG. 2 shows a machine with a turret 21 that stepwise rotates around an axis 22 that is stationary or fixed as seen in the X- and Y-directions. The turret 21 has a number of pick-up heads in different positions, for example 23 and 24. The machine picks components from the magazine bank 25 by moving the whole bank 25 in the X-direction so that the feeder with the wanted component is placed in the pick-up position 23, which basically is fixed. The component is picked up at position 23 and follows the turret 21 during the stepwise movement of the turret and will be mounted on a PCB when the head that picked up the component reaches position 24. A PCB 26 is moved so that the correct part of the PCB is placed below the placement position 24. Practically all component pick and place machines of the basic type shown in FIG. 2 are supplied with integral PCB conveyors. In FIG. 2, a PCB to be assembled on the input conveyor is waiting in position 27 and a PCB that has just been assembled is in position 28, ready to be moved to the right on the internal conveyor 29.

FIG. 3 shows a machine having a fixed Y-axis shown as two linear bearings 31 and 32. The fixed X-axis is shown as 33. A carriage 34 an which one or several pick-up heads 35 are mounted can move along the X-axis in the X-direction. The machine picks components from two magazine banks 36 and 37 by moving the head 35 to a position above the selected feeder, for example 38, and mounts the component on a PCB 39 which is movable in the Y-direction.

SUMMARY OF THE INVENTION

An object of the present invention is to provide a pick and place machine, in particular a surface mount machine, in which the time lost due to PCB board exchange is radically reduced.

Another object of the present invention is to provide a surface mount machine that can be equipped with more than one independently movable pick-up device and many feeders, and that permits full utilization of the independent movable pick-up devices even if the distribution of components in the feeders is badly balanced.

Thus, a mounting machine, in particular a surface mount machine, has a fixed X-axis comprising a straight beam rigidly mounted in the machine chassis along which one or several X-wagons moves, each one carrying at least one component pick-up device. Below the X-beam and the X-axis, component feeders are located which are organized in groups or banks, which are accessible by the pick-up devices. Also below the X-axis, there are at least two Y-axes provided by linear bearings, which are also rigidly mounted in the machine chassis. Y-wagons for carrying printed circuit boards move along the Y-axes. There are at least two Y-axes for carrying boards and it is arranged such that at least one of them presents a circuit board at a position on which the pick-up devices can place components. The time during which the pick-up devices must be idle during unload and load of boards will thereby be dramatically reduced.

Generally, in a method for placing components on boards, in particular electric or electronic circuit boards, there is at least one pick-up head which moves along a first direction, the X-direction, to a pick-up position where it lifts a component from a magazine. It then moves to a position above a board and finally lowers the component to an accurately determined position on the surface of the board, where the component is released. The board, before the component is released, is, for an accurate positioning, retained by a holding device such as a wagon and is moved in a direction essentially perpendicular to the moving direction of the at least one pick-up head. This condition is to be considered in such a way that the moving direction of the board is essentially perpendicular to the movement direction of the pick-up head at the point where the path of the board intersects the path of the head. The movement of the board is then performed to such a position that when the component is placed on the board, the accurately determined position thereof on the board is achieved. Components may then be placed on at least two boards, or at least two groups of boards, at least partly simultaneously. The two boards, or the board groups, are both moved, for positioning and exchange of boards, independently of each other along fixed paths which are essentially parallel and/or intersect the path of the head in directions being essentially perpendicular to the path of the at least one head. In particular the boards, or the groups, are moved to such positions that when a component is released from the head, an accurately determined position of the component on the board is achieved.

Therefore, when one board or group of boards that moves along one of the fixed board paths is moved away and is interchanged for a new board or a new group of boards, the at least one head continues to place components on a board or a group of boards that moves along another fixed board path.

The components may then advantageously be picked up by two essentially identical heads which work in parallel and thus have essentially parallel paths. When one of the heads has a picked-up component and is adjacent to or above a location on a board, it is movable along one fixed path where the component is to be placed, and during lowering and raising movements of the head at this location, the other head can be adjacent to or above or in contact with a component in a magazine, which is to be picked up, or shortly before it is picked up, and is to be placed by this other head.

A mounting/pick and place machine for transporting components from magazines to predetermined locations on boards, in particular a surface mounting machine, thus generally comprises a first pick-up head or pick-up wagon. The head is movable along a path, the X-path, preferably an essentially linear path. The path of the head extends from positions in which the head is capable of picking up components in magazines to positions in which the head is capable of placing components on a board. As is conventional, the head includes pick-up means such as a vacuum nozzle for picking up components, for holding them firmly during the transport, and for releasing the components. Further, there is a first device for holding a board or a group of boards on which components are to be placed. The first device is movable along a path, a Y-path, having a direction essentially perpendicular to the path of the first head. The first device is also movable to locations where components can be placed by the first head upon boards or groups of boards that are held by the first device. Such a machine is basically a prior art, one fixed X-axis, one fixed Y-axis machine. There is also arranged, however, a second device for holding a board or a group of boards, which is similar or identical to the first holding device. The second device is movable along a path, specifically a second Y-path, having a direction essentially in parallel to the direction of movement of the first device. The second device is also movable to locations where components can be placed by the pick-up head upon a board or boards carried thereby. This second holding device gives the machine an increased efficiency. Those time periods can be especially more efficiently used when a board or a group of boards held by a holding device is interchanged for another one.

Further, it may be advantageous to provide a second pick-up head which is movable along a path in parallel to, or identical with, the X-path, which is the path of the first head. The first and second holding devices should then be movable to locations where components can be placed, by the second head, on boards or groups of boards held by the second device. This arrangement will further increase the efficiency of the machine.

Magazines for components, which are to be mounted on the boards, may be organized in at least two banks. A first bank is advantageously located at one side of the path of the first holding device and a second bank is located at one side of the path of the second device in such a way that the two Y-paths of the holding devices are located between the banks or that none of the first and second banks are located between the paths of the first and second holding devices. Then the paths of the two holding devices can be located such that a large or long board can be held by the two holding devices in combination. Also the two heads can more easily place components on a board or a group of boards carried by one of the holding devices.

However, it may be advantageous to locate a third bank of magazines between the paths of the first and second holding devices. This will allow a larger degree of versatility when picking components, and thus also for arranging the components which are to be picked and placed, at suitable positions for optimizing the mounting time of the boards.

A board conveyor can be arranged for conveying boards to and from the holding devices. The paths of the boards conveyed by the conveyor are then preferably essentially perpendicular to the paths of the holding devices, allowing an easy loading and unloading of boards.

The heads can each one comprise, in the conventional way, a pick-up means, which is movable along a path having a direction, the Z-direction, which is essentially perpendicular to the paths of the heads and of the holding devices. The pick-up means can then be mounted in a mirror fashion, so that they for instance are arranged at side parts of the heads which face each other or in those parts of the heads which are located most adjacent each other. It allows that the two heads can work at places in magazines or at boards located close to each other.

In another aspect of the machine, there is generally a first head as described above. However, there is a first holding device for holding a board on which components are to be mounted and a second holding device for holding a board on which components are to be mounted and a magazine holding components which are to be mounted on the boards. The magazine should then be located essentially between the first and second holding devices. Such a design will allow the head to work at one board when the other board is exchanged for a new one, implying that the head in most cases will not have to be idle. Also, in this case, a second head like the second head above may be provided.

DETAILED DESCRIPTION OF THE PREFERRED EXEMPLARY EMBODIMENTS

Figure 4:
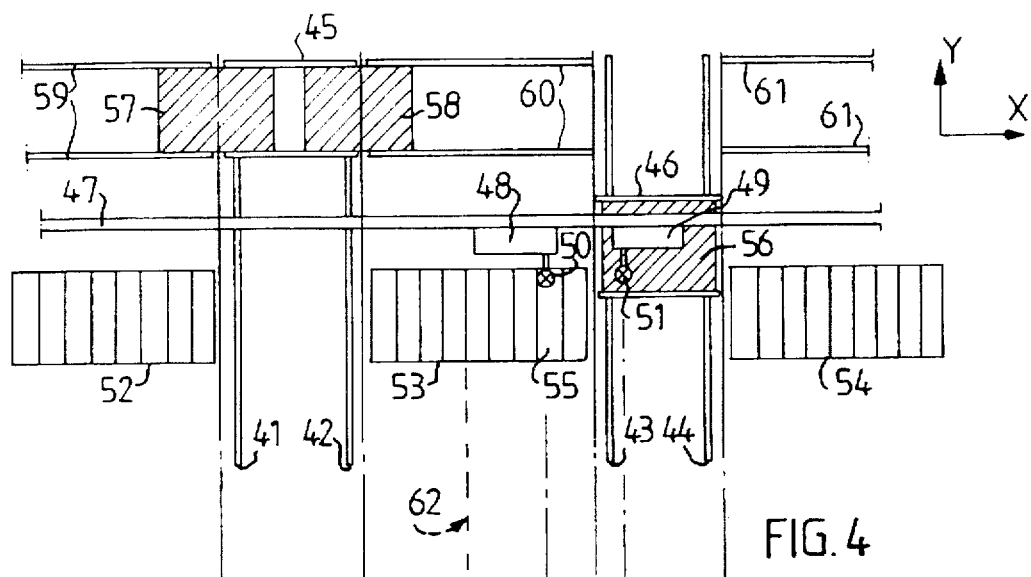
FIG. 4 shows a fixed X-axis, dual Y-axis machine having three magazine banks.

FIG. 4 shows a machine that has two fixed Y-axes shown as two sets of two linear bearings 41, 42 and 43, 44, respectively. These bearings are thus all parallel to each other. Two Y-wagons 45 and 46 are movable along these two Y-axes. The machine has one fixed X-axis 47 comprising for instance a straight beam equipped with suitable linear bearings. Two X-wagons 48 and 49 are movable along these bearings, thus along the X-axis 47. The machine further has three magazine banks 52, 53 and 54, each one comprising several individual feeders, arranged in parallel to each other, from which the machine picks components by moving a head 50 to a position in one of the banks above a selected component feeder 55. It then can place the component on the PCB 56 by suitable movements of the X-wagon 48 and the PCB carrying Y-wagon 46, these movements thus taking place in the X-direction and the Y-direction, respectively.

In the case where the X-wagons each carry only one pick-up head, the X-wagons 48 and 49 can advantageously be designed as mirror images of each other so that the pick-up head 50 of the left wagon 48 is placed as far to the right as possible and the pick-up head 51 of the right wagon 49 is placed as far to the left as possible. Thus, the sides of the wagons where pick-up heads are arranged face each other.

FIG. 4 shows the machine during an instant when the Y-wagon 45 is performing a PCB exchange. The PCB 58 is rigidly kept in a fixed position on the Y-wagon 45 while being mounted with components, preferably from magazine bank 52 and the left part of magazine bank 53. The PCB 58 has thereby got approximately 50% of all components assembled and is, during the instant shown in FIG. 4, transferred to the PCB conveyor 60 simultaneously as a not yet fully-assembled PCB 57 is fed into the Y-wagon 45 from the PCB conveyor 59.

Figure 1:
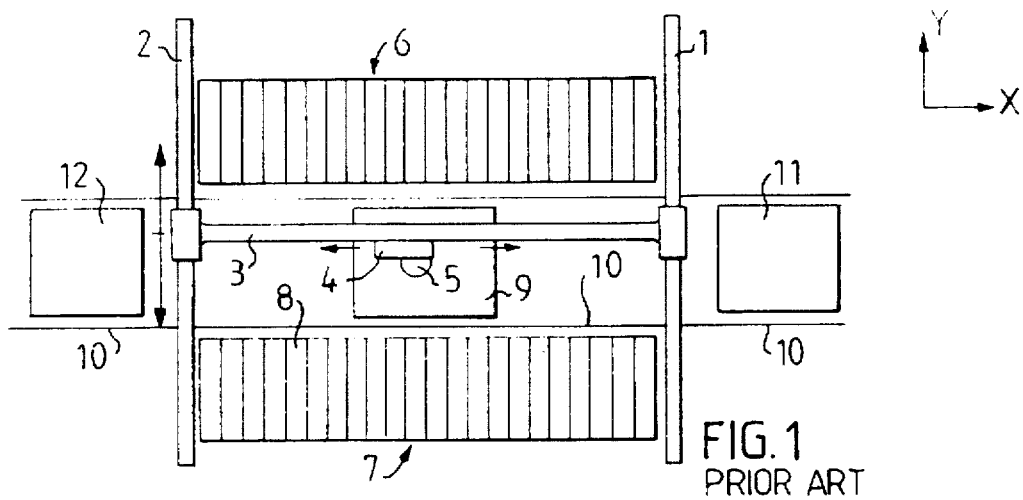
FIG. 1 shows a prior art fixed X-axis, moving Y-axis machine.

A problem with the machine using several heads is the balancing. In short series production, it is a waste of expensive operator time to optimize the placement of the component feeders in the magazine banks, such as banks 6 and 7 of FIG. 1 or banks 52, 53, 54 of FIG. 4, for every new board type. As long as a component type is available in an accessible magazine bank, it is advantageous if it can remain in its current position. The total assembly capacity of the machine of FIG. 4 has a low sensitivity to the current position of the various feeders. This can be illustrated by a very simple algorithm that simply divides the machine in two logical machines similar to the one shown in FIG. 3. This is done by introducing an imagined division boundary somewhere in magazine bank 53. One such boundary is shown as broken line 62 in FIG. 4. The PCB is first locked onto Y-wagon 45 and is then mounted with all components from magazine bank 52 and those components of magazine bank 53 that are located to the left of the line 62. Remaining components are mounted when the PCB is inserted in the other Y-wagon 46.

The system shown in FIG. 4 can, to some extent, be regarded as two machines having a common basic frame. Unlike a system that consists of two separate machines, the operating system of a machine like the one shown in FIG. 4 can easily be arranged in a way that will keep both X-wagons actively performing continuously meaningful assembly work. While components from the magazine banks 52 and 54 normally should be handled by the X-wagons 48 and 49, respectively, components from the central magazine bank 53 can arbitrarily be assigned to any of the two X-wagons. The only case in which an X-wagon will be idle is in the case that more assembly time is needed to assemble the components taken from magazine bank 52 (or 54) than what is required to handle the components taken from both of the banks 53 and 54 (or both of 53 and 52). In embodiments where banks such as 52 are far longer than the X-wagons 48 and 49, both wagons can also pick components synchronously in the outer banks like 52 or 54.

Figure 3:
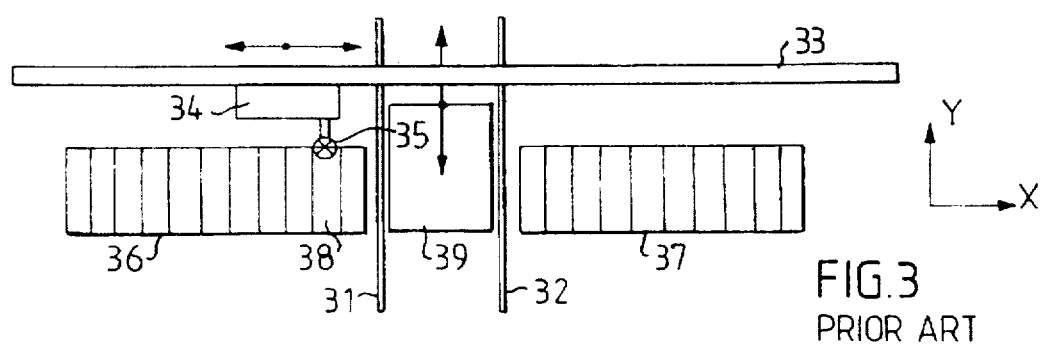
FIG. 3 shows a prior art fixed X-axis fixed Y-axis machine.

The average pick-to-place distance for a machine according to FIG. 4 will be less than for a machine according to FIG. 3 with the same number of feeders. Therefore, each X-wagon in the machine according to FIG. 4 will get a higher assembly capacity than a whole machine according to FIG. 3 with the same number of feeders. As a consequence, each feeder in a machine according to FIG. 4 will deliver more than twice as many components per hour as a similar feeder in a machine according to FIG. 3 with one Y-wagon and the same number of feeders.

Figure 5:
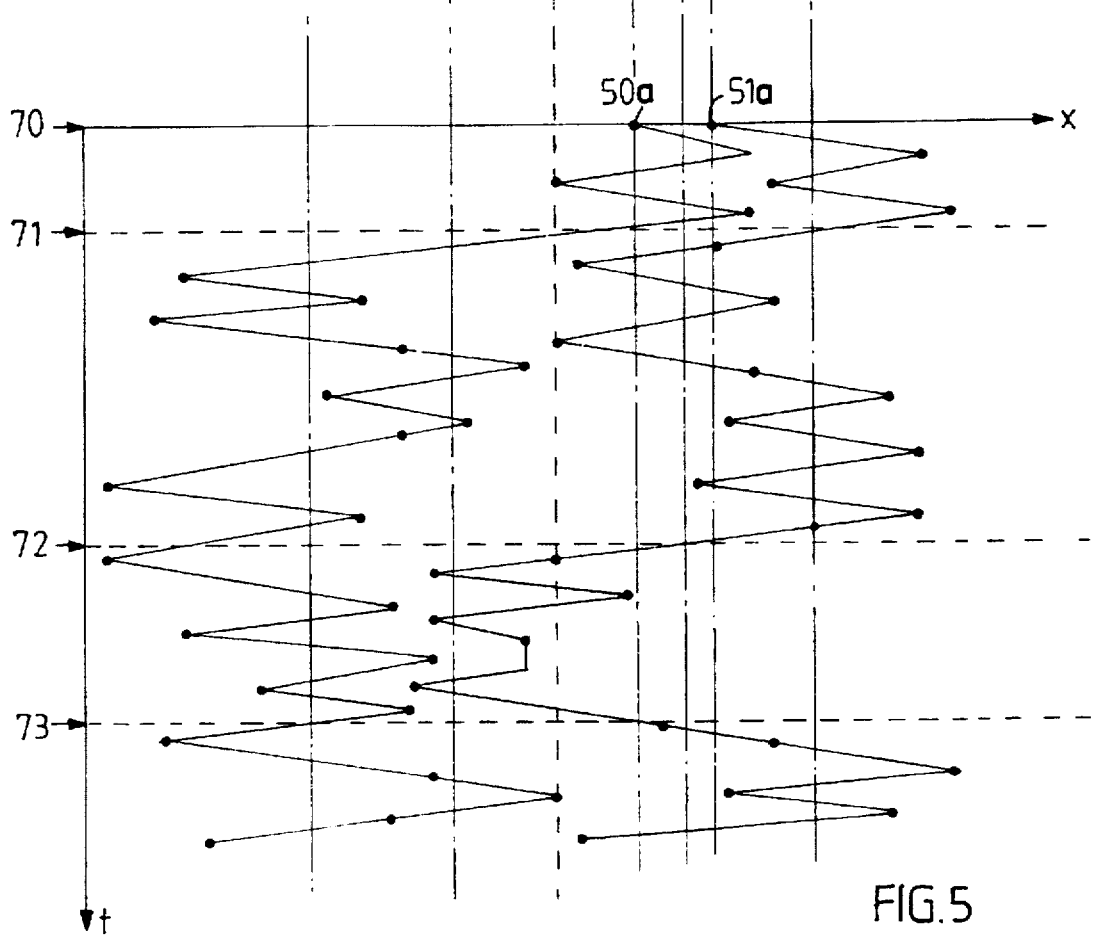
FIG. 5 shows a time diagram of movements of two pick-up heads of the machine of FIG. 4.

FIG. 5 illustrates the X-movements of the two pick-up heads 50 and 51 plotted against time during an assembly sequence. The Figure is very simplified in that the wagon movements required to catch reference point positions are omitted, the wagons carry only one pick-up head each, the number of components picked for each PCB is very low, etc.

At the top of the Figure, the positions of the two heads as in FIG. 4 are represented as points 50a and 51a. The vertical axis of FIG. 5 shows the time, and the position 70 along this axis corresponds to the instant in time illustrated in FIG. 4. As the Y-wagon 45 at that time does not have any board in a mountable position, both X-wagons 48, 49 and their heads 50, 51 perform assembly operations on the PCB 56 that are carried by Y-wagon 46. X-wagon 48, with its mounting head 50, can pick components from the magazine banks 52 and 53, but picks mainly from the part of bank 53 that is to the right of line 62. The X-wagon 49, with its head 51, picks components from bank 54. Each one of the two X-wagons or heads will, to some extent, be dependent upon the movements of the other head since head 51 cannot place components far to the left of PCB 56 at the same time as head 50 places components far to the right of the same PCB. Furthermore, one wagon may have to wait while the Y-wagon 46 is moved from a Y-position that was suitable for the component just placed by the head of the other wagon to a Y-position that fits the component presently carried by its own head.

The loss of assembly speed due to the above-described dependence of the two wagons upon the movements of the other wagon can be substantially reduced or eliminated. The operation system can preferably select the components which are to be placed during the period when both wagons operate on the same Y-wagon.

At the point in time represented by broken line 71, the Y-wagon 45 has loaded the PCB 57 and placed it at a mountable position. The machine can now be run as two almost independent systems, each running one X-wagon and one Y-wagon. In the time interval represented by the distance between broken lines 71, 72, each head can place components in any X-position on its Y-wagon and pick components from almost any feeder given the limit set by the boundary represented by broken line 62. Access to feeders located close to the boundary represented by broken line 62 must however be restricted. When one wagon picks components from a feeder close to the boundary represented by broken line 62, it will occupy portions of the space along the main X-axis 47 that the other wagon would require if it, at the same time, were to attempt to pick a component from a feeder close to the boundary represented by broken line 62. During the time interval from time 71 to time 72, the machine should attempt to place components that would cause synchronization problems if placed during periods when both X-wagons have to operate on the same Y-wagon.

At time 72, all components required on the PCB 56 on Y-wagon 46 have already been placed. Since the Y-wagon 46 no longer has any PCB available for assembly at that time, both X-wagons 48 and 49, with their heads 50, 51, respectively, place components on the PCB 57, which is now carried by Y-wagon 45. X-wagon 49, with its head 51, can pick components from the feeder banks 54 and 53 but should preferably pick from the left part of the centrally located bank 53. X-wagon 48, with its head 50, picks components from the feeder bank 52.

At time 73, the Y-wagon has loaded PCB 58 and placed it in an accessible position. The machine can now be run as two almost independent systems each having one X-wagon and one Y-wagon. Unlike a system that consists of two separate machines, the operating system of a machine according to the present invention and as shown in FIG. 4 can easily be arranged in a way that will keep both x-wagons active performing meaningful assembly work continuously. This is possible since the time normally lost during board exchange in most cases can be used in the operating mode where both X-wagons place components on the remaining accessible board. This requires that the time required for two board exchanges is shorter than the time required for two wagons to mount all components by simultaneously placing them on the same PCB. Another way of expressing the same condition is that the time for mounting all components must be equal to or longer than the sum of the two time periods represented by the distance between lines 70 and 71 and lines 72 and 73 in FIG. 5.

Figure 6A:
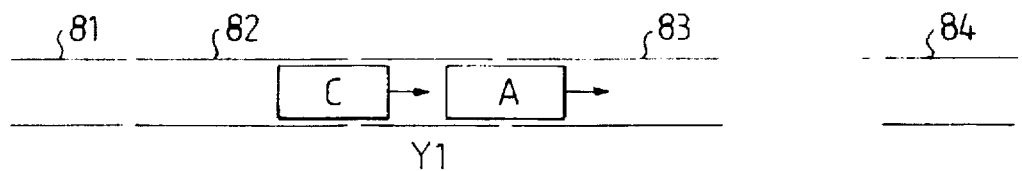
FIGS. 6a–6c show the movements of the PCB and the various PCB conveyors of the machine shown in FIG. 7.
Figure 6B:
Figure 6C:
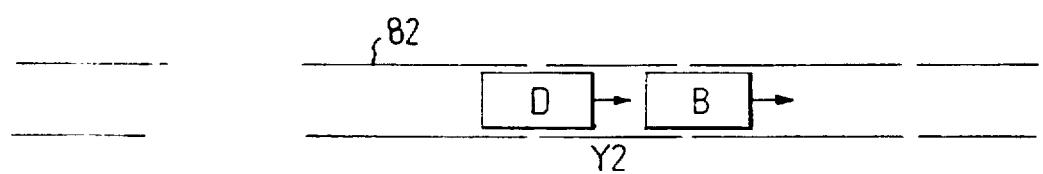
Figure 7:
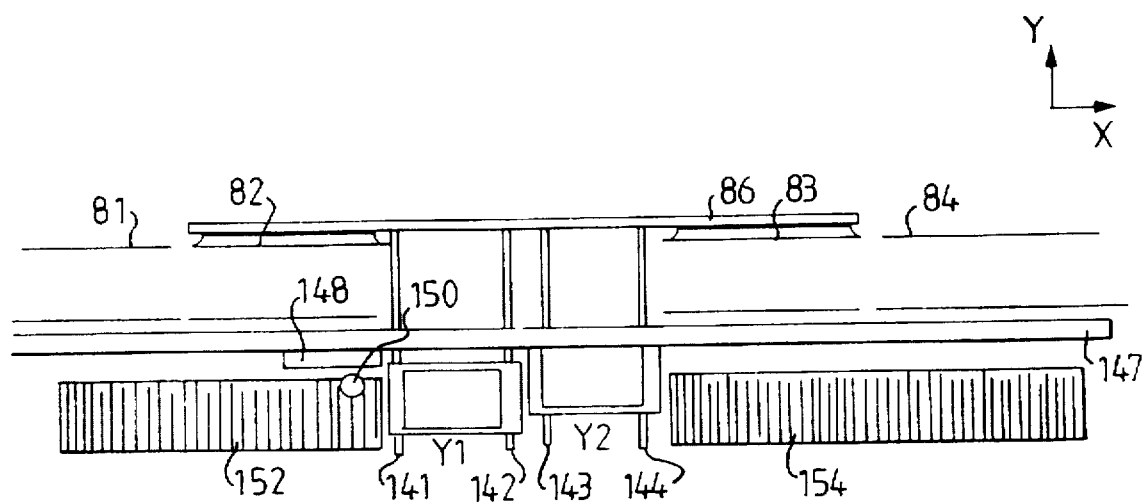
FIG. 7 shows a fixed X-axis, dual Y-axis machine having two magazine banks.

FIG. 7 illustrates an embodiment where there is no central feeder bank 53 but the Y-wagons move in a path adjacent to one another. The two Y-wagons Y1 and Y2 can then be made half as wide as normally required to handle the maximum PCB length. In the (rare) cases where very long PCBs have to be handled, the two Y-wagons can operate simultaneously and carry the same board. In this embodiment, it is thus no longer possible to divide the center feeder bank in order to give both assembly heads the same workload. Instead, in this embodiment the remaining banks 152 and 154 will normally be far longer than the wagons 48 and 50. Therefore, both wagons can pick components synchronously in the same bank 152 or 154, albeit with a lower efficiency. On the other hand, the total length along the X-axis required for the two Y-wagons is reduced (in the extreme case approximately by 50%), which permits more feeders to be kept in the same machine length. The possibility remains to let both heads operate on one Y-wagon while the other Y-wagon performs a PCB exchange. The embodiment of FIG. 7 is however also well suited to machines having only one X-wagon. FIGS. 6a–6c show only the board feeder parts and Y-wagons of the machine, and the following description refers to an embodiment where only one X-wagon is used.

FIG. 6a shows the board conveyors when the wagon Y1 is changing from board A to board C. The new board C has previously been fed from the fixed conveyor 81 to the load conveyor 82, which is movable in the X-direction and which, in FIG. 6a, is in its home (left) position. The already assembled board A is fed onto the unload conveyor 83, which is movable in the X-direction, and which, in FIG. 6a, is in its "pick-up from Y1" position. Assembly work is done on board B on wagon Y2.

FIG. 6b shows the board conveyors in a case where both Y-wagons keep the boards C and B respectively in positions suitable for component placements. The next board D is being fed from the fixed conveyor 81 to the load conveyor 82, which is movable in the X-direction and which in FIG. 6b is in its home (left) position. The already assembled board A is fed onto the fixed conveyor 84 from the unload conveyor 83, which is movable in the X-direction and which, in FIG. 6b, is in its home (right) position. Assembly work is done on board C on wagon Y1 and on board B on wagon Y2.

FIG. 6c shows the board conveyors when the wagon Y2 is changing from board B to board D. The new board D has earlier, as shown in FIG. 6b, been fed from the fixed conveyor 81 to the load conveyor 82 when conveyor 82 was in its home position. The load conveyor 82 has then moved to its "load Y2" position and is now moving the new board D into wagon Y2 at the same time as the already assembled board B is fed onto the unload conveyor 83, which is movable in the X-direction, and which, in FIG. 6c, is in its home (right) position. Assembly work is done on board C on wagon Y1.

FIG. 7 thus shows a fixed X-axis dual Y-axis machine with two magazine banks using the PCB feeding devices illustrated in FIGS. 6a–6c. The machine has two feeder banks 152 and 154, and one X-axis 147 with an X-wagon 148 carrying one pickup head 150. The two Y-wagons Y1 and Y2 run on linear bearings 141–144, and the two X-wise movable load and unload conveyors run on linear bearings, one of which is represented by 86.

In the descriptions above, each Y-wagon is loading one board only at the same time. It is however preferable to load as many boards as possible on one single Y-wagon. If, for example, the number of boards loaded is increased from 1 to 4, the board exchange time (such as the time intervals 70, 71 and 72, 73 in FIG. 5) will increase only moderately, while the total number of components to assemble will increase four times. Loading four short boards on the same Y-wagon will therefore increase the time in an amount such as 71, 72 during which the two wagons can operate almost independently of each other much more than the time represented by 70, 71 where the two X-wagons are much more dependent of each other. If at least two boards can be loaded on each Y-wagon, they should preferably be fixed close to the left and right ends of the Y-wagon. Such placements of the boards on the Y-wagon will give greater freedom for the two heads 50 and 51 to place components simultaneously, as the number of placement positions that are sufficiently far from each other in the X-direction will increase when a PCB is fixed at the left edge of the Y-wagon and another PCB is fixed close to the right edge.

Figure 2:
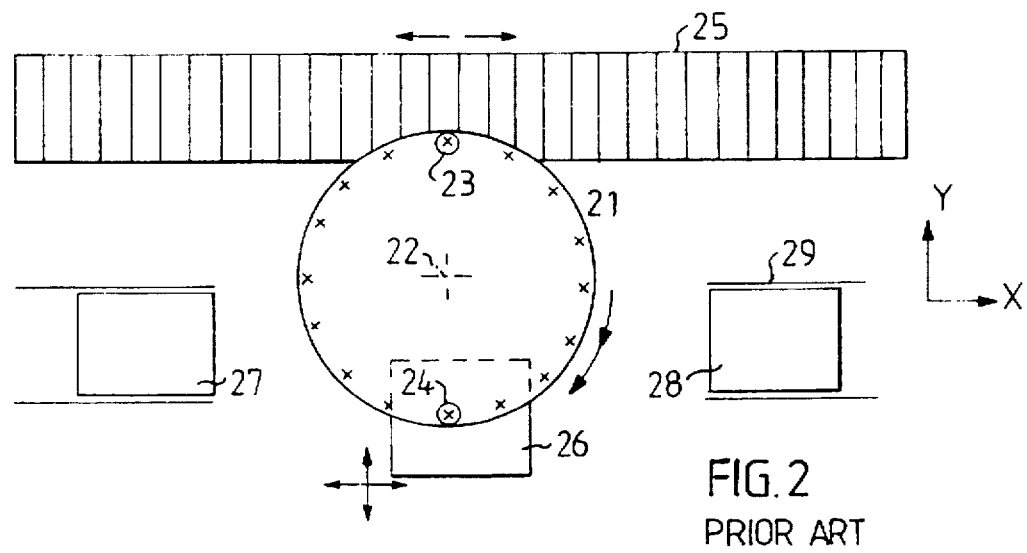
FIG. 2 shows a prior art rotary turret machine.

In the descriptions above, each X-wagon 48 is carrying only one pick-up head 50. The wagons 48 can however carry two or more pick-up heads that perform separate pick-up, a plurality of pick-up heads that normally perform simultaneous pick-up, or a small multihead turret similar to the turret shown in FIG. 2 with a vertical turret axis or a horizontal axis rotating multihead turret like the ones used in some machines manufactured by Siemens and Eurosoft.

In the description above, the two X-wagons share a common X-axis. Alternatively, two basically parallel axes or one common axis base with separate linear bearings can be used. As is obvious for those skilled in the art, the invention can be implemented in many ways using concepts common in pick and place machines, which have not been shown or indicated in the description above. The pick-up operation of the pick-up heads can be performed using vacuum nozzles or mechanical pliers. The components can be centered using mechanical, optical image processing or other means. Components held by the pick-up heads must, in most cases, be rotated using extra means (not shown in FIG. 4). Each magazine bank can be made as a single trolley permitting very quick feeder group exchange, as a group of quickly exchangeable feeder cassettes, or as a stationary frame into which separate feeders are inserted. The system can mount components on substrates other than PCBs, for example on thin film hybrid substrates. The actual position on the boards should in many cases be determined using optical fiducial reference points. This requires, in most embodiments, some extra movements, not shown in FIG. 5, of the X- and Y-wagons to place X-wagon mounted cameras, not shown in FIGS. 4 or 7, above the fiducial marks, not shown in FIGS. 4 or 7, on the PCB. All movements of PCBs along the conveyors, movements of wagons, etc., require motors, not shown, and controller means, such as micro controllers, not shown.

What is claimed is:

1. A method of placing components on boards, the method comprising:

moving at least two boards independently of each other, each board being moved along one of two separate fixed board paths, the board paths being substantially parallel to each other, moving away a first board included in the at least two boards and interchanging the first board for a new board, and performing component placing steps as follows:

moving the pick-up head to a pick-up position, picking up a component from a magazine with the pick-up head, moving the pick-up head to a position above a second board included in the at least two boards, the second one of the at least two boards being different from the first board, lowering the pick-up head to an accurately determined position at the surface of the second board, releasing the component from the pick-up head and placing it on the second board, raising the pick-up head, and repeating the above component placing steps on the second board and on the new board.

2. The method as claimed in claim 1, wherein at least two substantially identical pick-up heads working in parallel are moved, the component placing steps being performed for each pick-up head simultaneously, whereby components are placed on the at least two boards at least partly simultaneously.

3. The method as claimed in claim 2, wherein the component placing steps of the at least two pick-up heads are performed so in time that when one pick-up head holding a picked-up component is in a position adjacent to or above a location on a board included in the at least two boards, at which location the component is to be placed, and during the steps of lowering and placing and raising of the head in this position, another pick-up head is in a position adjacent to or above or in contact with a component in a magazine, for which component the component placing steps are to be performed by said another pick-up head for placing the component on a board.

4. A method of placing components on boards, in particular electric or electronic circuit boards, wherein a pick-up head is moved along a pick-up head path, the method comprising:

moving at least two boards independently of each other, each board being moved along one of two separate fixed board paths, the board paths being substantially parallel to each other and intersecting the path of the pick-up head in directions substantially perpendicular to the pick-up head path at least at points where the board paths intersect the pick-up head path, and simultaneously performing component placing steps as follows:

moving the pick-up head along the pick-up head path to a pick-up position, picking up a component from a magazine with the pick-up head, moving the pick-up head along the pick-up head path to a position above a board included in the at least two boards, lowering the pick-up head to an accurately determined position at the surface of the board, releasing the component from the pick-up head and placing it on the board, the step of moving the at least two boards being performed so that the board is moved to such a position that when the component is placed on the board, an accurately determined position of the component on the board is achieved, raising the pick-up head, and repeating the above component placing steps for placing components on the board and on another board included in the at least two boards.

5. The method as claimed in claim 4, wherein the step of moving the at least two boards includes the step of moving away one board included in the at least two boards and interchanging the board for a new board, and during the step of moving away and interchanging the board, the component placing steps of the pick-up head being performed for placing components on another board included in the at least two boards.

6. The method as claimed in claim 4, wherein at least two substantially identical pick-up heads working in parallel are moved along pick-up head paths, the component placing steps of the pick-up head being performed for each pick-up head simultaneously, whereby components are placed on the at least two boards at least partly simultaneously.

7. The method as claimed in claim 6, wherein the component placing steps of the at least two pick-up heads are performed so in time that when one pick-up head holding a picked-up component is in a position adjacent to or above a location on a board included in the at least two boards, at which location the component is to be placed, and during the steps of lowering and placing and raising of the head in this position, another pick-up head is in a position adjacent to or above or in contact with a component in a magazine, for which component the component placing steps are to be performed by said another pick-up head for placing the component on a board.

8. A mounting/pick-and-place machine for transporting components from magazines to predetermined locations on boards, the mounting/pick-and-place machine comprising:

magazines for components to be placed by the mounting/pick-and-place machine, a first pick-up head movable between loading positions where the first pick-up head is capable of picking up components in magazines, and placing positions, where the first pick-up head is capable of placing components on a board, the first pick-up head including pick-up means for picking up and releasing components, a first device for holding a board on which components are to be placed, the first device being movable along a first device path to first mounting locations where components can be placed by the first pick-up head on a board held by the first device, and a second device for holding another board on which components are to be placed, the second device being movable independently of the first device along a second device path to second mounting locations where components can be placed by the first pick-up head on a board held by the second device, the second device path having a direction substantially parallel to the direction of the first device path.

9. The mounting/pick-and-place machine as claimed in claim 8, wherein the first pick-up head path is substantially linear.

10. The mounting/pick-and-place machine as claimed in claim 8 further comprising:

a second pick-up head that is movable along a second pick-up head path, the second pick-up head path being parallel or identical to the first pick-up head path, and wherein the first device and the second device are movable to locations where components can be placed by the second pick-up head on boards held by the first device and by the second device.

11. The mounting/pick-and-place machine as claimed in claim 10, wherein a third bank of magazines for components is located between the first device path and the second device path.

12. The mounting/pick-and-place machine as claimed in claim 10, wherein the first pick-up head and the second pick-up head each comprise a pick-up means, such pick-up means being movable along a path having a direction substantially perpendicular to the first pick-up head path and the second pick-up head path, respectively, and perpendicular to the first device path and the second device path, respectively.

13. The mounting/pick-and-place machine as claimed in claim 12, wherein the pick-up means are mounted at sides of the first pick-up head and the second pick-up head, respectively, that face each other.

14. The mounting/pick-and-place machine as claimed in claim 8, wherein the magazines for components are organized in at least two banks, a first bank being located at a side of the first device path and a second bank being located at a side of the second device path, said sides of the first device path and the second device path being chosen in such a way that none of the first and second banks are located between the first device path and the second device path.

15. The mounting/pick-and-place machine as claimed in claim 8 further comprising a board conveyor for conveying boards to and from the first device and to and from the second device along a conveyor path, the conveyor path being substantially perpendicular to the first device path and the second device path at least at points where the conveyor path intersects the first device path and the second device path.

16. The mounting/pick-and-place machine as claimed in claim 8, wherein the first pick-up head comprises a pick-up means that is movable along a path having a direction essentially perpendicular to the first pick-up head path and perpendicular to the first device path and the second device path.

17. A mounting/pick-and-place machine for transporting components from magazines to predetermined locations on boards, the mounting/pick-and-place machine comprising:

magazines for components to be placed by the mounting/pick-and-place machine, a first pick-up head movable along a first pick-up head path, the first pick-up head path extending from positions where the first pick-up head is capable of picking up components in magazines to positions where the first pick-up head is capable of placing components on a board, the first pick-up head including pick-up means for picking up and releasing components, a first device for holding a board on which components are to be placed, the first device being movable along a first device path, the first device path having a direction that is substantially perpendicular to the first pick-up head path at least at a point where the first device path intersects the first pick-up head path, the first device being movable along the first device path to locations where components can be placed by the first pick-up head on a board held by the first device, and a second device for holding another board on which components are to be placed, the second device being movable along a second device path, the second device path having a direction that is substantially perpendicular to the first pick-up head path at least at a point where the second device path intersects the first pick-up head path, the second device being movable along the second device path to locations where components can be placed by the first pick-up head on a board held by the second device.

18. The mounting/pick-and-place machine as claimed in claim 17, wherein the second device path has a direction substantially parallel to the direction of the first device path at least at points at which the second device path and the first device path intersect the first pick-up head path.

19. The mounting/pick-and-place machine as claimed in claim 17, wherein the first pick-up head path is substantially linear.

20. The mounting/pick-and-place machine as claimed in claim 17, further comprising:

a second pick-up head that is movable along a second pick-up head path, the second pick-up head path being parallel or identical to the first pick-up head path, and wherein the first device and the second device are movable to locations where components can be placed by the second pick-up head on boards held by the first device and by the second device.

21. The mounting/pick-and-place machine as claimed in claim 20, wherein the first pick-up head and the second pick-up head each comprise a pick-up means, such pick-up means being movable along a path having a direction substantially perpendicular to the first pick-up head path and the second pick-up head path, respectively, and perpendicular to the first device path and the second device path, respectively.

22. The mounting/pick-and-place machine as claimed in claim 21, wherein the pick-up means are mounted at sides of the first pick-up head and the second pick-up head, respectively, that face each other.

23. The mounting/pick-and-place machine as claimed in claim 17, wherein the magazines for components are organized in at least two banks, a first bank being located at a side of the first device path and a second bank being located at a side of the second device path, said sides of the first device path and the second device path being chosen in such a way that none of the first and second banks are located between the first device path and the second device path.

24. The mounting/pick-and-place machine as claimed in claim 23, wherein a third bank of magazines for components is located between the first device path and the second device path.

25. The mounting/pick-and-place machine as claimed in claim 17 comprising a board conveyor for conveying boards to and from the first device and to and from the second device along a conveyor path, the conveyor path being substantially perpendicular to the first device path and the second device path at least at points where the conveyor path intersects the first device path and the second device path.

26. The mounting/pick-and-place machine as claimed in claim 17, wherein the first pick-up head comprises a pick-up means that is movable along a path having a direction essentially perpendicular to the first pick-up head path and perpendicular to the first device path and the second device path.

27. A mounting/pick-and-place machine for transporting components from magazines to predetermined locations on boards, the mounting/pick-and-place machine comprising:

a first pick-up head movable along a first pick-up head path, the first pick-up head path extending from positions where the first pick-up head is capable of picking up components in magazines to positions where the first pick-up head is capable of placing components on a board or a group of boards, the first pick-up head including pick-up means for picking up and releasing components, a first device for holding a board on which components are to be mounted, a second device for holding a board on which components are to be mounted, the first pick-up head path being such that the first pick-up head can place components on a board held by either one of the first device and the second device, and a magazine for components to be placed by the mounting/pick-and-place machine, the magazine being located substantially between the first device and the second device.

28. The mounting/pick-and-place machine as claimed in claim 27, wherein the first pick-up head path is substantially linear.

29. The mounting/pick-and-place machine as claimed in claim 27 further comprising a second pick-up head movable along a second pick-up head path, the second pick-up head path being parallel or identical to the first pick-up head path and extending from positions where the second pick-up head is capable of picking up components in magazines to positions where the second-pick-up head is capable of placing components on a board, the second pick-up head including pick-up means for picking up and releasing components.

* * * * *